(12) United States Patent
Olson

(10) Patent No.: US 6,267,867 B1
(45) Date of Patent: Jul. 31, 2001

(54) COMPOSITE ARTICLE WITH ADHERENT CVD DIAMOND COATING AND METHOD OF MAKING

(75) Inventor: James M. Olson, Londonderry, NH (US)

(73) Assignee: Saint-Gobain Industrial Ceramics, Inc., Worcester, MA (US)

(*) Notice: Subject to any disclaimer, the term of this patent is extended or adjusted under 35 U.S.C. 154(b) by 0 days.

(21) Appl. No.: 09/300,646

(22) Filed: Apr. 27, 1999

Related U.S. Application Data

(60) Provisional application No. 60/086,781, filed on May 26, 1998.

(51) Int. Cl.$^7$ .............................. C25F 3/00; B44C 1/22; C23C 14/02; H05H 1/00; B05D 3/04
(52) U.S. Cl. ................... 205/640; 205/660; 216/37; 216/57; 216/58; 427/534; 427/535; 427/585; 427/309
(58) Field of Search ....................... 205/205, 209, 205/640, 219, 660; 216/56, 37, 58; 427/534, 535, 585, 309

(56) References Cited

U.S. PATENT DOCUMENTS

| | | | |
|---|---|---|---|
| 5,635,256 | * | 6/1997 | Olson .................................. 427/536 |
| 5,650,059 | * | 7/1997 | Shumaker et al. ............... 205/660 X |
| 5,891,522 | * | 4/1999 | Olson .................................. 427/309 |

* cited by examiner

*Primary Examiner*—Donald R. Valentine

(57) ABSTRACT

A process for coating a tungsten carbide base material substrate with CVD diamond film includes carburization and gas-assisted vaporization of cobalt from the surface with simultaneous recrystallization of surface grains of tungsten carbide to change their stoichiometry for improved adherence. Also disclosed is a WC—Co cutting tool having a relatively fine WC grain size and being coated with adherent CVD diamond.

14 Claims, 2 Drawing Sheets

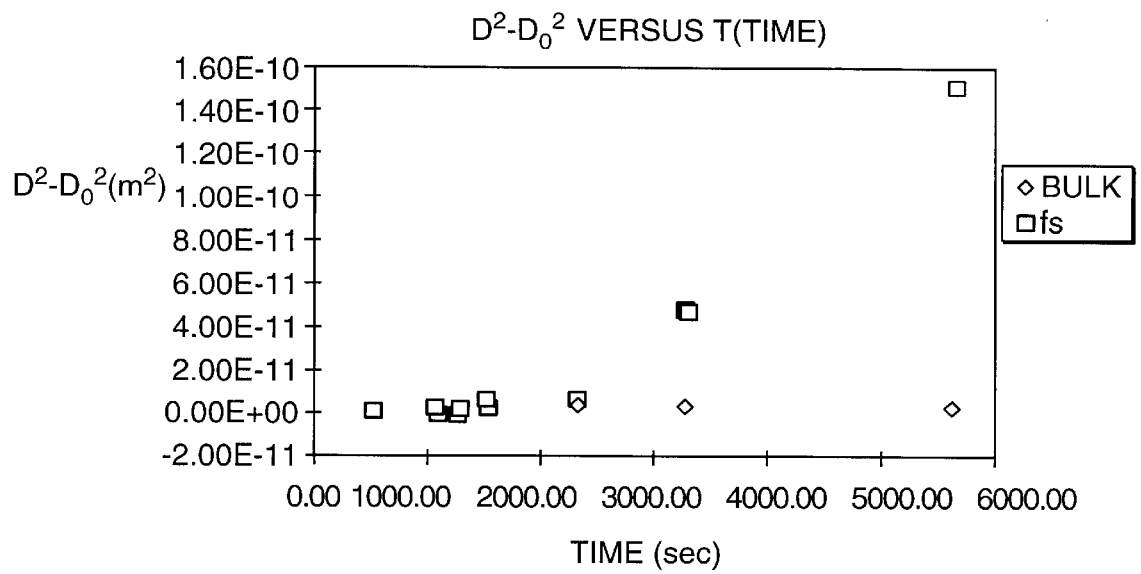
FIG. 2  AVERAGE GRAIN SIZE OF THE WC PHASE WITHIN THE BULK (◇) AND AT THE FREE-SURFACE (□) AS A FUNCTION OF TREATMENT TIME.
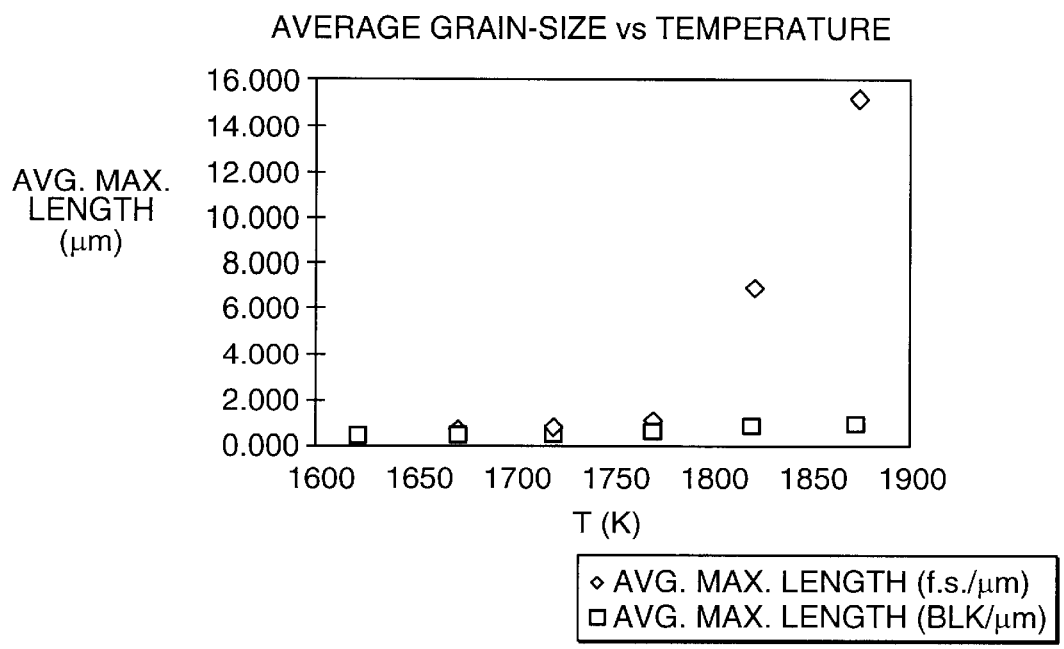
FIG. 3  AVERAGE GRAIN SIZE OF THE WC PHASE AT THE FREE-SURFACE (◇) AND WITHIN THE BULK (□) AS A FUNCTION OF TREATMENT TEMPERATURE.

COMPOSITE ARTICLE WITH ADHERENT CVD DIAMOND COATING AND METHOD OF MAKING

This application claim benefit to provisional Application No. 60/086,781 May 26, 1998.

FIELD OF THE INVENTION

The invention relates to composite articles which are coated with diamond and more specifically to cutting tools made of cemented carbide which are coated with diamond by chemical vapor deposition (CVD).

BACKGROUND OF THE INVENTION

Several properties of diamond, such as its hardness and thermal conductivity, make it highly desirable for use as a coating or thin-film applied to articles whose life is limited by excessive wear, such as cutting tools. However, because diamond is a brittle material, in the form of a monolith it does not have the toughness of other traditional cutting tool materials, such as tungsten carbide or PDC (polycrystalline diamond compact). Toughness is especially important to the performance of cutting tool materials in environments where impulsive or high impact forces may be involved, for example in interrupted cutting. The use of diamond as a thin-film, or coating, takes advantage of the wear resistant properties of the thin-film while also taking advantage of the bulk properties (toughness) of an underlying substrate base material. However, in order to successfully realize these advantages, the adhesion strength of the diamond film to the underlying substrate must allow the thin-film and substrate to operate as a "composite" system. This may be particularly challenging for some base materials due to thermal expansion mismatch between the film and substrate which gives rise to very large residual stresses. In addition, the chemical composition of some base materials can impair or prevent the formation of strong bonds between the film and substrate. Ignoring these effects can lead to very weak bonding and may result in delamination of the film or coating from the base material of the substrate during use.

One of the most important base materials for various kinds of flat and rotary cutting tools is cemented carbide, such as tungsten carbide (WC) ceramic particles sintered in a matrix of cobalt (Co) binder. The utility of this class of materials is based upon the combination of a hard, abrasive phase (WC grains) which is cemented or bonded by a metal, ductile phase (Co binder). While the metal binder phase gives the cemented carbide toughness, it is this constituent which is primarily responsible for the difficulties encountered in establishing adhesion to CVD diamond films. Under typical conditions of CVD diamond synthesis, the binder phase of cemented carbides, which is commonly cobalt, but may also be iron or nickel, may interact with the gaseous CVD diamond growth species and catalyze the formation of graphitic material instead of or in addition to diamond. The formation of a graphitic layer on the substrate results in poor adhesion between the film and substrate. In addition, during the chemical vapor deposition of diamond films, the binder phase may dissolve the diamond substrate interface, thereby reducing the interfacial contact area between the film and substrate to degrade mechanical bonding. Finally, the mismatch in thermal expansion between the diamond film and substrate typically results in large residual stresses in the diamond film following deposition which further challenges the interface integrity.

Early efforts to improve the adhesion of diamond films to WC—Co materials led researchers to remove cobalt from the surface of WC—Co materials using several techniques. In U.S. Pat. No. 4,731,296, Kikuchi et al. discuss the formation of an "etch layer" with reduced cobalt concentration extending to between 0.1 to 1.0 micrometers (micrometers) into a WC—Co based substrate with 1–4 wt % (weight percent) Co. This method encourages the nucleation and growth of diamond films without the preferential deposition of graphite. However, methods based on the chemical removal of the binder phase have several drawbacks which can influence the utility of the diamond coated article. Removal of the binder phase to a depth which is greater than the general size dimension of the free surface grains results in the formation of an embrittled layer at the surface of the WC—Co article. In the presence of an applied stress, such as the residual stresses imposed on the diamond film following deposition or those encountered during use of the article, failure of the interface by loss of WC grain cohesion or by crack extension in this embrittled area results in delamination. On the other hand, removal of the binder phase to a depth which is less than the general size dimension of the free surface WC grains usually results in interaction between the diamond and binder phase unless a physical barrier to diffusion across the interface is created. Furthermore, these approaches do not have a means of producing a mechanically tough, interfacial crack deflection mechanism which is necessary to provide the interfacial fracture toughness required for the abrasive applications of metal cutting.

Other researchers have recognized that a physical barrier or so-called "diffusion barrier" to diamond/binder interaction may improve adhesion by preventing interaction between the binder phase and the diamond film. Proper selection of such a layer may also reduce residual stresses between the diamond film and the underlying substrate by selection of an interlayer material having a coefficient of thermal expansion with a value between those of the film and underlying substrate. However, the interlayer approach is not preferred because it is complicated, expensive, and does not result in the increase in interfacial toughness which other techniques achieve.

The U.S. Pat. No. 5,415,674 issued to Feistritzer et al. discloses a technique to vaporize and re-crystallize surface WC grains. This process is a significant improvement over methods which produce a sub-surface binder-depleted region. However, this process is carried out at a temperature too low for rapid grain growth of the free surface WC grains. There is no discussion of the important details of free surface chemical composition or structural features of the free surface of the WC—Co which are necessary for adhesion of the diamond film under abrasive conditions as described above.

The U.S. Pat. No. 5,100,703 issued to Saijo discloses a process for treating WC—Co having a binder phase of 4 wt % (weight percent) or less by using a decarburizing gas comprised of oxygen and hydrogen between a temperature of 500 and 1200° C. (centigrade). While decarburization of the free surface WC grains promotes re-carburization during CVD diamond deposition and thus promotes chemical bonding between the diamond film and substrate, the method disclosed in this patent results in a free surface in which the WC grains are smaller than the WC grains in the bulk. This process therefore does not contain the crack deflection or interfacial toughening mechanism essential for highly abrasive applications.

The U.S. Pat. No. 5,648,119 issued to Grab et al. discloses the formation of a roughened substrate to improve the "mechanical component of adhesion". The roughness is provided by subjecting the article to a second, resintering process which causes grain growth of the WC particles which are located at the surface. However, the time and temperature required for adequate grain growth at the surface as described therein also results in some grain growth in the bulk material in addition to a significant reduction in the binder phase composition. Several mechanical properties of this class of materials are proportional to the binder phase content. Therefore, this reduction of the binder content resulting from execution of this process can lead to a reduction in important properties such as the fracture toughness and transverse rupture strength.

There is a need for a process for coating a cemented carbide article with a strongly adherent diamond film by which both the mechanical and chemical components of bonding are optimized without degradation of the substrate bulk properties.

SUMMARY OF THE INVENTION

The present inventor has made the surprising observation that when some of the binder is removed at the surface and from around a portion of the surface particles to expose their surfaces, the grain growth of these WC particles takes place by means of a mechanism which is different from that by which grain growth occurs within the bulk of the article. Under these conditions, the grain growth of the particles at the surface proceeds as much as two orders of magnitude faster than that of the particles in the interior of the article which are at the same temperature. Therefore, by first removing some of the binder at the surface and then establishing grain growth conditions, the surface grain growth can be accomplished in a time so short that there is virtually no deleterious effect at all in the adjacent bulk material.

In accordance with the novel process of the present invention, a cemented carbide article is first treated by some chemical, electrochemical or other means in order to remove some of the binder phase at some temperature below 1000° C. An example of such a means is by etching in dilute $HNO_3$. The binder phase removal should be limited to a depth of around 1–4 micrometers and to removal of between 0.005% and 0.04% of the overall binder phase content of the article. The article then has its surface treated at an elevated temperature and in a gas environment to remove some additional binder from the free surfaces of the exposed particulates of the surface region, while at the same time carburizing a surface depth region of the binder remaining between exposed surface particulates. Simultaneously with the removal of binder, the WC particulates grow in size and undergo a change in the stoichiometry of their free surface region, which becomes somewhat depleted of carbon. When exposed to diamond growth conditions, these carbon-depleted free surface regions of the particulates are initially recarburized, and in the process of doing so form a stronger chemical bond with the deposited diamond. With the process of the invention, it becomes feasible to adhere CVD diamond to WC with relatively small particulate dimensions and a low surface roughness, thus resulting in a smoother surface finish where that might be desired. Moreover, the resulting coated article also possesses the essential structural characteristics of the diamond/substrate interface which maximize interfacial crack deflection in order to prevent delamination of the diamond.

BRIEF DESCRIPTION OF THE DRAWINGS

FIG. 2 is a graphical representation of the grain size distribution in the substrate bulk as compared to that at the surface with sintering time.

FIG. 3 is a graphical representation of the average grain size in the bulk as compared with that at the surface with time of sintering.

DETAILED DESCRIPTION

Figure 1:
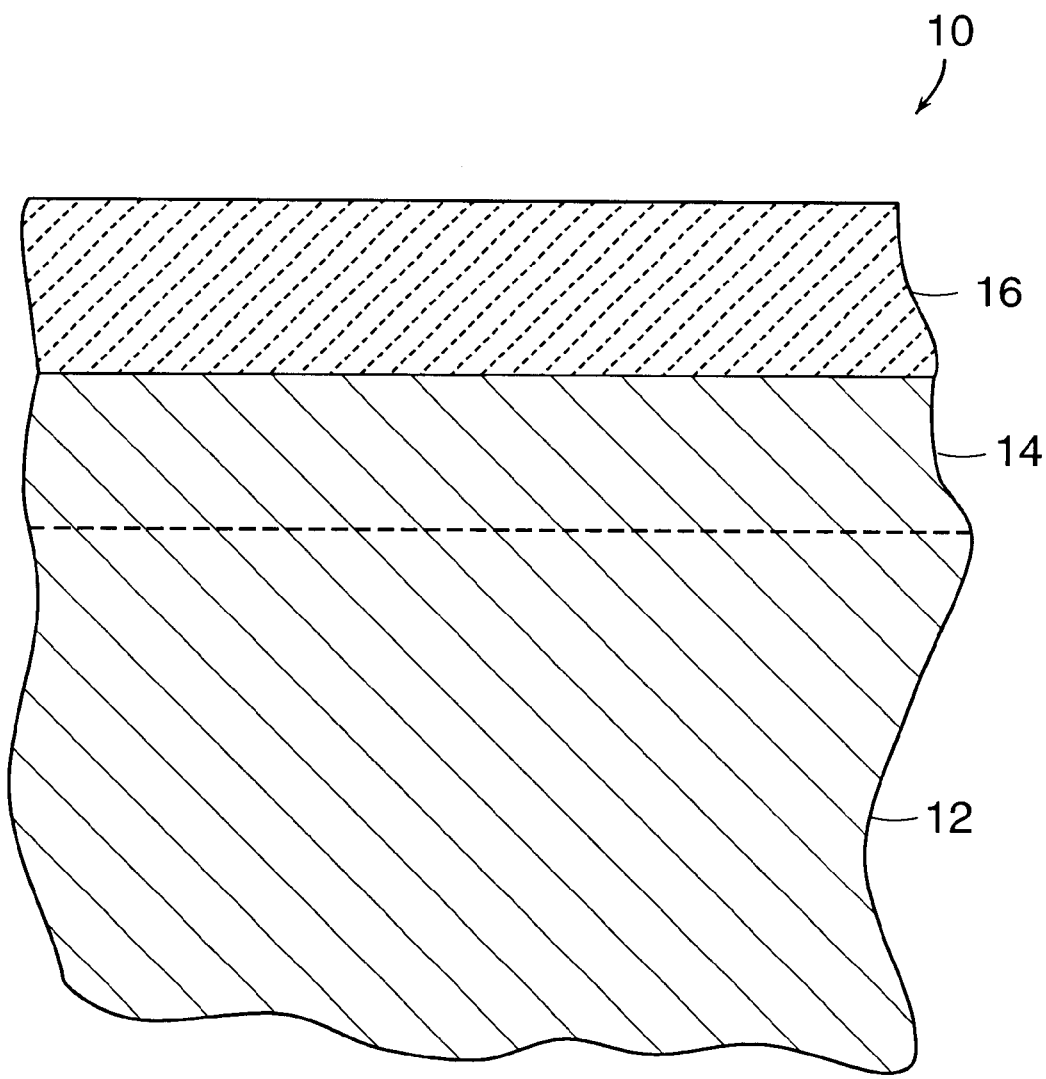
FIG. 1 is a schematic cross-sectional view of a fragment of a substrate of base material which has been coated with CVD diamond in accordance with one embodiment of the present invention.

The novel process described below is considered an improvement over previously disclosed processes (U.S. Pat. Nos. 5,635,256, 5,674,620). Drawbacks to the previously disclosed process include binder phase reduction of 1–2 wt %. Since the binder phase content of WC—Co materials has a strong influence on the mechanical properties of the substrate, uniform reduction of the binder phase content can reduce important mechanical properties. In addition, even though the increase in the grain size of the WC phase at the free-surface occurs at a rate several orders of magnitude greater than in the bulk, some bulk grain growth has been measured over the course of treatment time necessary to sufficiently vaporize the free-surface cobalt and grow the WC grains at the free surface. Since grain growth within the bulk can also reduce fracture toughness, it is desireable to minimize bulk grain growth. Finally, in the previously disclosed processes (U.S. Pat. No. 5,635,256) the binder phase is still present at the interstices of small grains at or near the free-surface. When viewed from the free-surface, the population of these small grain is low for the desired range of surface treatment. Nonetheless, the binder phase at the interstices of these small grains can result in some interaction between the binder phase and film which results in a reduction in the adhesion strength.

In thermodynamic studies of the free-surface grain growth in WC—Co materials, it was found that the rate of grain growth at the free-surface as described by the equation $$(D^2 - D_0^2)/t = K$$

(where D is the average diameter of a grain, $D_0$ is the initial diameter of a WC grain, K is the growth rate constant and t is time) is several orders of magnitude greater than grain growth of the WC phase in the bulk. The rate may be quantitatively described by the so-called grain-growth constant, K, and it was found that K is several orders of magnitude greater at the free surface than in the bulk. It was further observed that $K_{free-surface}$ remained similar to $K_{bulk}$ until the binder phase content was reduced to a level where the WC grains were sufficiently exposed at the free surface. At this point, $K_{free-surface}$ increases rapidly as illustrated in FIG. 2. Similar experiments carried out under a range of treatment temperatures and constant treatment periods produced similar results. The increase in the free-surface growth rate corresponds to the point at which the free-surface binder phase is removed by rapid vaporization when it is in the liquid state (T≧1493° C.) as illustrated in FIG. 3.

The benefits of such a process over the previously disclosed process are:
1. The binder phase reduction is limited to $0.005\% \leq \%Dm_{loss} \leq 0.04\%$ compared to the $1.00\% \leq \%Dm_{loss} \leq 2.5\%$ reduction which generally occurs with prior art processes.
2. The free-surface grain size of the WC phase reaches a more uniform distribution, reducing the liklihood of the presence of binder phase near the free-surface at the interstices of smaller WC grains.
3. The decrease in high-temperature treatment time reduces the liklihood of
   a) distortion of the part and
   b) undesired grain growth of the WC phase in the bulk.
4. Increases the range of compositions which may be treated to compositions with higher binder phase content.

By means of the process of the present invention, the chemical composition of the substrate/diamond interface is controlled to minimize deleterious binder phase-diamond reactions which can reduce the chemical bonding of the diamond film to the substrate and which can also induce a deleterious phase transformation of the diamond film to graphite. The phase composition of the WC phase is controlled to maximize the density of direct chemical bonding between the diamond film and substrate. Unlike chemical etching methods, which de-carburize the WC grains by chemically attacking them, this decarburization is achieved without sacrificing the mechanical properties of the substrate or interface.

The process in accordance with the present invention permits control of the microstructural composition of the interface to minimize crack nucleation sites due to interfacial voids and to provide a toughening crack deflection mechanism which resists interfacial crack propagation. This feature essentially arrests or deflects cracks which may nucleate at the interface and impedes the propagation of these cracks to thereby suppress delamination of the diamond. The crack deflection mechanism is evolved without gross damage to the surface, such as results from abrading or blasting. Furthermore, the process of the present invention makes it feasible to use base material for the substrate which has a relatively small WC grain size, thereby resulting in a much smoother diamond coating surface, since the diamond coating surface profile tends to mirror that of the underlying substrate surface.

General Features of the Process

In accordance with the invention, an article 10, a fragment of which is shown in cross-section in FIG. 1 composed of commercially available WC—Co in its bulk region 12 with up to 10 wt % Co and having an average particle size in the range of from about 0.25 microns to 1.0 microns is sintered to form a cemented carbide article. The article may then be ground to a final desired geometry, which may include chip-forming or other complex surface features. The surface of the article to be coated is then etched, for example with dilute nitric acid (HNO3), to a depth of between about 1–4 micrometers, so that the binder phase reduction at the surface is between about 0.005% and about 0.04%. The etching could also be by other means, such as electrochemical. The article is then treated at an elevated temperature in the presence of activated hydrogen, hydrocarbon, or inert gas in order to simultaneously a) vaporize the free surface binder phase, b) induce growth of the WC grains at the free surface, and c) shift the stoichiometry of the free surface WC grains to a carbon-deficient ratio without formation of the of the brittle eta phase of WC ($M_6C$, $M_{12}C$). The free surface thus produced is microstructurally roughened and cobalt-free, and the WC phase is de-carburized (with respect to bulk WC grains). An important feature of the process is that the WC grains within the bulk 12 are left essentially un-altered by the process. The substrate is then coated with a diamond film 16 of between 5 and 50 micrometers thick under temperature and time conditions which limit diffusion of the binder phase from a surface depth region 14 to the interface.

During the early stages of the process, the WC grains at the free surface undergo common Ostwald ripening and re-crystallization. Following this, continued mass transport of W and C atoms result in grain-growth of the WC phase. However, while the conditions at the free surface support rapid grain growth of the surface WC grains, the grains within the bulk material grow at a much slower rate. For this reason, the important mechanical advantages of a fine-grained WC—Co material are retained within the bulk material. Under continued processing, the stoichiometery of the individual WC grains at the free surface is shifted in such a way that a stoichiometeric gradient exists on individual grains. Continued treatment or annealing under these conditions would eventually lead to the formation of the brittle eta-phase, which is a carbon-deficient W—C—Co phase, by essentially reducing the carbon concentration of WC grains at the free surface. The vaporization grain growth thermal de-carburization process of the present invention may be achieved under a range of processing conditions by varying time and temperature appropriately. In the course of the grain growth, some cobalt migrates toward to surface to fill in between the exposed grains of tungsten carbide. This prevents voids from forming between the substrate and the diamond film deposited on it.

The novel process leaves the free surface of the substrate essentially free of the cobalt binder phase, as confirmed by analytical techniques such as energy dispersive spectroscopy (EDS). The removal of the binder phase from the free surface occurs by vaporization and entrainment of the binder phase by process gases. Raising the temperature of the WC—Co material shifts the gas-liquid-solid equilibrium and produces a partial pressure of the metallic binder phase above the tool. Entraining this vapor by using an inert gas such as nitrogen or argon enables more surface cobalt to be vaporized. If the rate of vaporization is greater than the bulk-to-surface diffusion rate, the free surface will be essentially free of the binder phase. The temperature at which this process is carried out is a function of gas composition and gas velocity rate. For instance, if a dissociated hydrogen gas is used, vaporization occurs at a temperature below the standard melting point temperature of pure Co, which is 1495 degrees C. However, if nitrogen is used, the rapid grain growth and vaporization occurs at a temperature at or above the melting point temperature. At temperatures above the melting point of the binder phase, the growth process occurs rapidly. However, temperatures below the melting point temperature may be preferred to minimize any gravity-induced deformation of the article in its relatively soft state during processing.

Following the evolution of the surface microstructure and chemical composition as described above, the surface is coated with a diamond film. During the initial stage of the CVD diamond nucleation or incubation period, carbon source gas re-carburizes the free surface WC grains and thus promotes direct chemical bonding between the diamond film and the WC grains at the interface. Diamond growth is thereby achieved under conditions which suppress bulk-to-interface diffusion of the binder phase. Further particulars are described in J. M Olson, Master of Science and Engineering Thesis, Department of Mechanical Engineering, Worcester Polytechnic Institute, May 1998, which work is hereby incorporated herein by reference in its entirety.

EXAMPLE 1

A commercially available WC—Co cutting tool insert with 6 wt % Co binder, an average grain size of 0.5–1.0 micrometers, and a ground free surface was etched at the surface to be coated, for example with dilute nitric acid (HNO3), to a depth of between about 1–4 micrometers, so that the binder phase reduction is the surface is between about 0.005% and about 0.04%. The etching could also be by other means, such as electrochemical. The insert was then placed in a commercially-available vacuum-sintering graphite furnace. The sample was placed on a bed of graphite and SiC particles. The graphite was in the form of a graphite paint which covers a layer of SiC particulates. The graphite is present to suppress the formation of eta phase material. The SiC particles form a barrier between the insert and any supporting kiln furniture to prevent fusion of the insert to such furniture. The sample was heated to a temperature of 1560 deg. C. (Centigrade) in the presence of flowing nitrogen under a pressure of 0.30 torr for approximately 45 minutes and cooled to room temperature. The exact time, temperature and carbon concentration of the binder phase were controlled to promote the vaporization of the binder phase and the growth and de-carburization of the WC phase. These parameters are a function of batch size and geometry of the item being processed and can be readily ascertained by those skilled in the art. Following treatment, the free surface of the WC—Co article was characterized by EDS (energy dispersive spectrometery), XRD (x-ray diffraction), and SEM (scanning electron microscopy). EDS revealed the presence of W and the absence of Co at the surface. XRD revealed Co and WC with no formation of eta phase material. SEM showed free surface grain growth in the WC phase by extension of prismatic planes. The part was then coated with a 30 mm thick diamond film and tested by machining Reynold's A390 aluminum stock at 2500 surface feet per minute, 0.005 inches per revolution, and 0.025 inches depth of cut. The tool life was approximately 50% that of a PDC-tipped cutting tool insert subjected to a similar test. The tool failed by excessive wear, but not by delamination of the diamond film.

EXAMPLE 2

A commercially-available WC—Co cutting tool insert having 6 wt % Co, an average grain size of 0.5 mm–1.0 mm, and a ground free surface was etched at the surface to be coated, for example with dilute nitric acid (HNO3), to a depth of between about 1–4 micrometers, so that the binder phase reduction is the surface is between about 0.005% and about 0.04%. The etching could also be by other means, such as electrochemical. The sample was then placed in a dc arc-jet CVD diamond deposition system. The sample was placed in a holder which allows for accurate control of temperature and processing conditions during deposition as described in copending patent application Ser. No. 08/473,198 of J. Olson filed Jun. 7, 1995, entitled SPINNING SUBSTRATE HOLDER FOR CUTTING TOOL INSERTS FOR IMPROVED ARC-JET DIAMOND DEPOSITION and assigned to the same assignee as is the present invention. In the presence of dissociated hydrogen, the sample was heated to a temperature of between 1200° C. and 1350° C. in a pressure of about 5 torr. The surface of the WC—Co cutting tool insert was maintained in these conditions for a period of about 0.5 hours, during which a low concentration (approximately 0.10%) of methane was cycled on and off at 5 minute intervals. Diffusion transport (gettering) of the vaporized binder phase was controlled by the presence of a low temperature sink in close proximity to the processing inserts. The free surface was characterized by EDS, XRD and SEM as described above. EDS revealed the presence of W and absence of Co at the surface. XRD revealed Co and WC with no formation of the eta-phase. SEM showed free surface grain growth in the WC phase by extension of prismatic planes. The gas phase carbon, which is necessary to suppress the formation of eta-phase material, may also be supplied as a solid source by placing graphite in the pockets of the holder, for instance.

What is claimed is:

1. A method of preparing, for subsequent coating, the surface of a composite body which comprises hard ceramic particulates embedded in a metal binder material without deleteriously effecting the fracture toughness of the bulk material of the body, comprising:

a) removing some of the binder material at the surface to be coated, b) removing additional binder material from the free surface of the particulates which are exposed at the surface to be coated by gas-assisted vaporization, and c) simultaneously with removing the additional binder material, preferentially inducing growth and thermal de-carburization of the particulates at the free surface without inducing accompanying growth of particulates within the bulk of the body.

2. The method of claim 1 wherein the removing of some binder is carried out by a wet chemical process.

3. The method of claim 2 wherein the chemical process is an electrochemical process.

4. The method of claim 1 wherein the removing of some of the binder is by a thermal process which is carried out with the body temperature not exceeding 1,000 degrees C.

5. The method of claim 4 wherein the thermal process includes holding the body at an elevated temperature for a period of between about 0.5 and 2.0 hours.

6. The method of claim 5 wherein the vaporization is carried out by subjecting the surface of the body to a plasma treatment in an atmosphere of elemental hydrogen.

7. The method of claim 6 wherein the hydrogen is at a pressure of about 1 torr to about 100 torr.

8. The method of claim 7 wherein the plasma treatment is carried out in a plasma jet apparatus.

9. The method of claim 8 wherein the plasma treatment is carried out for about 0.5 hours and the temperature of the body is maintained at a temperature of from 900° C. to 1600° C.

10. The method of claim 9 wherein the plasma jet apparatus is a d.c. arc jet.

11. The method of claim 10 comprising coating the body with a diamond film in the same apparatus as is used for the plasma treatment.

12. The method of claim 11 wherein the plasma treatment is continued for about 0.5 hours and the temperature of the body is maintained at a temperature of from 1350° C. to 1450° C.

13. The method of claim 12 wherein the edge of the body is honed prior to treatment.

14. The method of claim 13 wherein the edge of the body is chamfered prior to treatment.

* * * * *